(12) United States Patent
Kikuchi

(10) Patent No.: US 10,373,635 B2
(45) Date of Patent: Aug. 6, 2019

(54) MAGNETIC HEAD SUSPENSION ASSEMBLY HAVING FLEXIBLE WIRING MEMBER WITH CONNECTION TERMINAL INCLUDING CENTER HOLE AND COVER LAYER AND DISK DEVICE PROVIDED WITH THE SAME

(71) Applicant: KABUSHIKI KAISHA TOSHIBA, Tokyo (JP)

(72) Inventor: Takafumi Kikuchi, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 71 days.

(21) Appl. No.: 15/693,414

(22) Filed: Aug. 31, 2017

(65) Prior Publication Data
US 2018/0277150 A1  Sep. 27, 2018

(30) Foreign Application Priority Data
Mar. 24, 2017 (JP) ................ 2017-059609

(51) Int. Cl.
*G11B 5/48* (2006.01)
*H05K 1/11* (2006.01)
*H05K 1/02* (2006.01)
*H05K 3/36* (2006.01)
*H05K 1/18* (2006.01)

(52) U.S. Cl.
CPC ............ *G11B 5/486* (2013.01); *G11B 5/4846* (2013.01); *G11B 5/4853* (2013.01); *H05K 1/028* (2013.01); *H05K 1/118* (2013.01); *H05K 3/363* (2013.01); *H05K 1/113* (2013.01); *H05K 1/189* (2013.01)

(58) Field of Classification Search
CPC ...... G11B 5/4846; G11B 5/4853; G11B 5/486
USPC ............................... 360/264.2, 245.9
See application file for complete search history.

(56) References Cited

U.S. PATENT DOCUMENTS 6,396,665 B1 * 5/2002 Asano .................. G11B 5/4833
                                        360/264.2
8,173,909 B2 * 5/2012 Cayaban ................ H05K 3/363
                                        174/263
(Continued)

FOREIGN PATENT DOCUMENTS

JP    H07-297542 A    11/1995

*Primary Examiner* — Jefferson A Evans
(74) *Attorney, Agent, or Firm* — Kim & Stewart LLP

(57) ABSTRACT

A magnetic head suspension assembly includes a support plate coupled to a magnetic head, and a flexible wiring member disposed on the support plate. The flexible wiring member includes a metal plate fixed to the support plate, an insulating layer disposed on the metal plate, a conductive layer disposed on the insulating layer and forming a plurality of conductive lines and connection terminals, and a cover layer on the conductive layer. The connection end portion includes a plurality of the connection terminals, and each of the connection terminals includes a center hole, a first terminal surface that is a surface of the conductive layer and is covered with the cover layer so that the first terminal surface is not exposed during a solder-joining process performed on the connection terminals, and a second terminal surface that is a surface of the conductive layer and faces away from the first terminal surface.

20 Claims, 14 Drawing Sheets

(56) References Cited

U.S. PATENT DOCUMENTS

| | | | |
|---|---|---|---|
| 8,395,866 B1 * | 3/2013 | Schreiber | G11B 5/486 360/245.8 |
| 9,460,757 B2 * | 10/2016 | Rothenberg | H05K 1/118 |
| 2003/0007331 A1 | 1/2003 | Kataoka | |
| 2005/0006140 A1 | 1/2005 | Birgel et al. | |
| 2006/0034018 A1 * | 2/2006 | Deguchi | G11B 5/486 360/245.9 |
| 2006/0087011 A1 * | 4/2006 | Kanagawa | G11B 5/4833 257/676 |
| 2008/0099236 A1 * | 5/2008 | Cayaban | H05K 3/363 174/263 |
| 2011/0090599 A1 * | 4/2011 | Feng | G11B 5/486 360/245.3 |
| 2013/0342936 A1 * | 12/2013 | Nishiyama | G11B 5/486 360/244 |
| 2015/0356986 A1 * | 12/2015 | Pan | G11B 5/4846 360/244.1 |
| 2016/0086624 A1 * | 3/2016 | Pan | G11B 5/4846 360/245.3 |
| 2017/0202082 A1 * | 7/2017 | Yamada | H05K 1/05 |
| 2017/0229635 A1 * | 8/2017 | Takano | H01L 41/053 |

* cited by examiner

MAGNETIC HEAD SUSPENSION ASSEMBLY HAVING FLEXIBLE WIRING MEMBER WITH CONNECTION TERMINAL INCLUDING CENTER HOLE AND COVER LAYER AND DISK DEVICE PROVIDED WITH THE SAME

This application is based upon and claims the benefit of priority from Japanese Patent Application No. 2017-059609, filed Mar. 24, 2017, the entire contents of which are incorporated herein by reference.

FIELD

Embodiments described herein relate generally to a suspension assembly, a head suspension assembly and a disk device that includes the same.

BACKGROUND

A disk device, for example, a magnetic disk device, generally includes a magnetic disk disposed on a base, a spindle motor supporting and rotationally driving the magnetic disk, and a suspension assembly supporting a magnetic head. The suspension assembly includes a suspension attached to the front end portion of the arm of a carriage, a flexible wiring member (flexure, or wiring trace) disposed on the suspension, and a load beam. The magnetic head is coupled to the head suspension and supported by a gimbal portion of the wiring member. A plurality of connection terminals are provided at the connection end portion of the wiring member. The connection end portion is solder-joined to the solder portion of a wiring board disposed on the carriage. Strict electrostatic discharge (ESD) management is carried out in the assembly process of such a magnetic disk device. However, with improvements in the recording density of data in recent years, the size of the read element of the magnetic head has been reduced. Consequently, head damage by ESD is a serious problem. Electrostatic discharge can result from, in particular, when the suspension assembly is incorporated in the carriage. Specifically, the physical contact between the connection end portion (i.e., the connection terminal end) of a wiring member and the solder portion of the wiring board, or the physical contact between the metal surface of one connection end portion of the wiring portion and the metal surface of another connection end portion due to overlapping of the connection end portions of the plurality of suspension assemblies on the wiring board, can result in ESD. Thus, these countermeasures have become very important.

DETAILED DESCRIPTION

Figure 1:
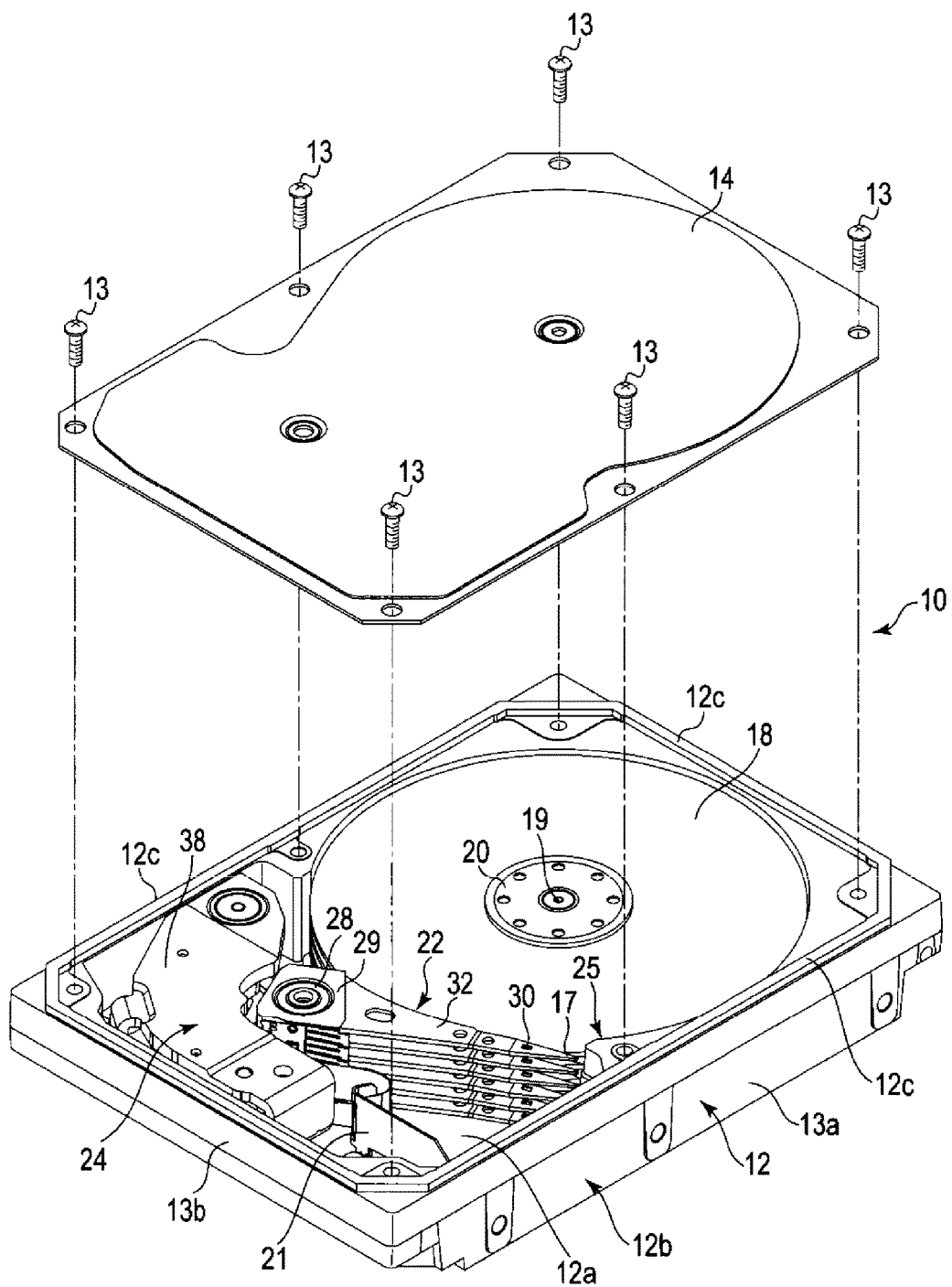
FIG. 1 is an exploded perspective view showing a hard disk drive (HDD) according to a first embodiment with a top cover removed.

Embodiments provide a suspension assembly, a head suspension assembly, and a disk device, capable of discouraging or preventing generation of electrostatic discharge.

In general, according to one embodiment, a magnetic head suspension assembly includes a support plate coupled to a magnetic head, and a flexible wiring member disposed on the support plate. The flexible wiring member includes a tip portion disposed on the support plate and a connection end portion disposed at an opposite end of flexible wiring member from the tip portion. The flexible wiring member further includes a metal plate fixed to the support plate, an insulating layer disposed on the metal plate, a conductive layer disposed on the insulating layer and forming a plurality of conductive lines and connection terminals, and a cover layer on the conductive layer. The connection end portion includes a plurality of the connection terminals, and each of the connection terminals includes a center hole, a first terminal surface that is a surface of the conductive layer and is covered with the cover layer so that the first terminal surface is not exposed during a solder-joining process performed on the connection terminals, and a second terminal surface that is a surface of the conductive layer and faces away from the first terminal surface.

A disk device according to an embodiment will be described below with reference to the accompanying drawings. It should be noted that the disclosure is merely an example, and may be appropriately modified by those skilled in the art without departing from the spirit of the disclosure or exceeding the scope of the present disclosure. Further, in order to clarify the explanation, a drawing of each part may be schematically represented in terms of the width, thickness, shape, and the like, as compared with the actual form, and is merely an example and is not intended to limit the scope of the present disclosure. In addition, in the specification and drawings, the same reference numerals are assigned to the same elements as those described previously with respect to previous drawings, and detailed description thereof may be omitted as appropriate.

First Embodiment

A hard disk drive (HDD) according to a first embodiment will be described in detail as a disk device. FIG. 1 is an exploded perspective view of the HDD according to the first embodiment, with the top cover removed. The HDD includes a flat and substantially rectangular casing 10. The casing 10 includes a rectangular box-shaped base 12 with the upper surface opened, and a top cover 14 screwed to the base 12 by a plurality of screws 13 to close the upper end opening of the base 12. The base 12 has a rectangular bottom wall 12a facing the top cover 14 with a gap therebetween, and a side wall 12b disposed along the peripheral edge of the bottom wall. The rectangular bottom wall 12a and the side wall 12b can be formed from a single piece of aluminum, for example. The side wall 12b includes a pair of long side walls 13a facing each other and a pair of short side walls 13b facing each other. A substantially rectangular frame-shaped fixing rib 12c protrudes at the upper end surface of the side wall 12b. The fixing rib 12c is integrally formed as a part of the side wall 12b.

The top cover 14 is formed, for example, of stainless steel in a rectangular plate shape. The top cover 14 has a shape and dimensions corresponding to the fixing rib 12c of the base 12. The top cover 14 is disposed on the side wall 12b of the base 12 inside the fixing rib 12c and closes the upper opening of the base 12.

The housing 10 includes a plurality of magnetic disks 18 as recording media, and a spindle motor 19 as a driving unit for supporting and rotating the magnetic disks 18. The spindle motor 19 is disposed on the bottom wall 12a. Each of the magnetic disks 18 has a magnetic recording layer on the upper and/or lower surface of the magnetic disk 18. Each magnetic disk 18 is coaxially fitted to a hub (not shown) of the spindle motor 19 and clamped by a clamp spring 20 and fixed to the hub. As a result, each magnetic disk 18 is supported so as to be positioned parallel to the bottom wall 12a of the base 12. Each magnetic disk 18 is rotated at a predetermined number of revolutions per minute by the spindle motor 19. It should be noted that any technically feasible number of the number of magnetic disks 18 can be located within the housing 10, and therefore the number of magnetic disks 18 is not limited to five, as shown in the present embodiment in FIG. 1. Further, a single magnetic disk 18 may be located within the housing 10.

A plurality of magnetic heads 17 are disposed within the housing 10, for recording on and reading information from a respective magnetic disk 18. A carriage assembly 22 is also disposed within the housing 10 that movably supports each of the magnetic heads 17 with respect to a respective magnetic disk 18. Further, the housing 10 includes a voice coil motor (hereinafter referred to as a VCM) 24 for rotating and positioning the carriage assembly 22, a ramp loading mechanism 25 for holding the magnetic heads 17 at an unloading position located away from the magnetic disks 18 when the magnetic heads 17 move to the outermost periphery of the magnetic disks 18, and a board unit (sometimes referred to as a flexible printed circuit unit or FPC unit) 21 on which an electronic component such as a conversion connector (not shown) is mounted. The carriage assembly 22 includes a rotatable bearing unit 28, an actuator block 29 having a plurality of arms 32 extending from the bearing unit 28, and a respective suspension assembly 30 extending from each of arms 32. Each of the magnetic heads 17 is supported at a tip portion of each of the suspension assemblies 30. Each magnetic head 17 includes a read element, a write element and the like.

A printed circuit board (not shown) is screwed onto the outer surface of the bottom wall 12a of the base 12. The printed circuit board controls the operation of the spindle motor 19. In addition, the printed circuit board controls the operation of the VCM 24 and the magnetic heads 17 via the board unit 21.

Figure 2:
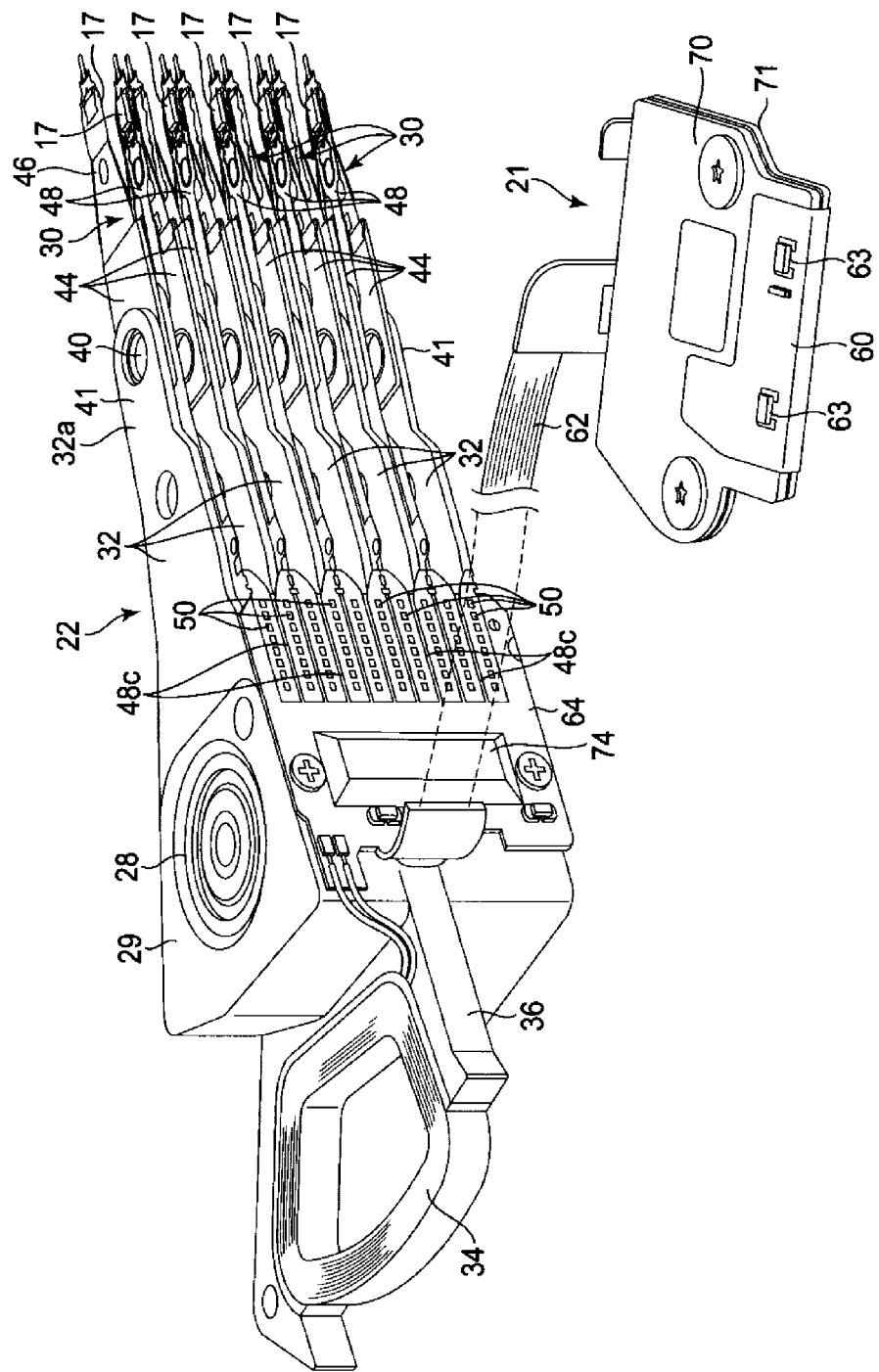
FIG. 2 is a perspective view showing a carriage assembly and a board unit of the HDD.

FIG. 2 is a perspective view showing a head actuator assembly having a carriage assembly 22 and a board unit 60. As shown in FIGS. 1 and 2, the carriage assembly 22 includes the rotatable bearing unit 28, the actuator block 29 that supports the bearing unit 28, six arms 32 extending from the actuator block 29, the suspension assemblies 30, each attached to a respective arm 32, and the magnetic heads 17, each supported by a respective suspension assembly 30. The bearing unit 28 has a pivot shaft mounted on the bottom wall 12a of the base 12 in the vicinity of the outer peripheral edge of the magnetic disks 18, and a plurality of bearings attached to the pivot shaft. The plurality of bearings of the bearing unit 28 are fitted in through-holes formed in the actuator block 29. Thus, the carriage assembly 22 is supported on the bottom wall 12a so as to be rotatable about the pivot shaft of the bearing unit 28.

As shown in FIG. 2, the six arms 32 extend in the same direction from the actuator block 29 and are positioned in parallel with each other and having a gap therebetween. Each of the arms 32 has a tip portion 32a on the end distal from bearing unit 28, and a seat surface 41 with a circular hole 40 that is formed in the tip portion 32a on upper and lower surfaces of the arm 32. In the present embodiment, the six arms 32 are integrally formed with the actuator block 29. Each of the arms 32 is formed, for example, of stainless steel, aluminum, or the like, in an elongated planar shape, and extends in a direction orthogonal to the pivot shaft of the bearing unit 28. It should be noted that the arms 32 may instead be independently formed and stacked on the bearing unit 28.

The actuator block 29 has a support frame 36 extending in a direction away from the arms 32, and the voice coil 34, which is a part of the VCM 24, is supported by the support frame 36. As shown in FIG. 1, the voice coil 34 is positioned between a pair of yokes 38 included as part of the VCM 24, one of which is fixed to the base 12, where each yoke 38 includes a magnet fixed thereto.

Figure 3:
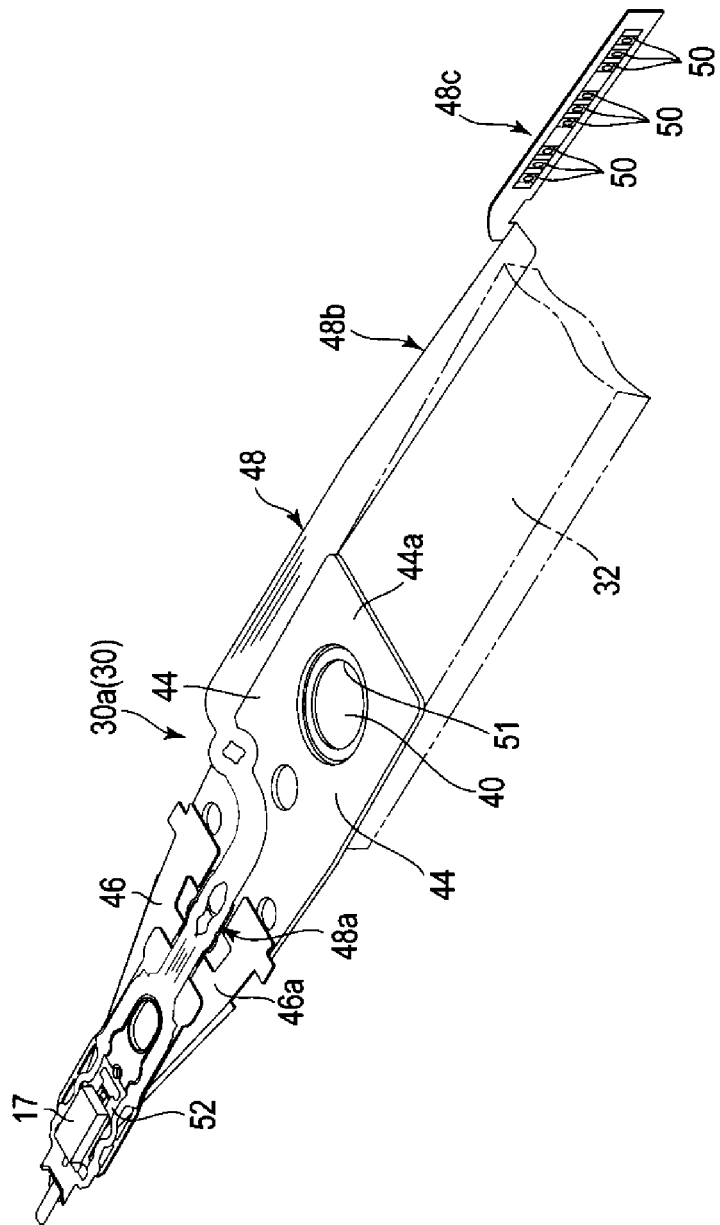
FIG. 3 is a perspective view showing the lower surface side (head surface side) of the head suspension assembly in the carriage assembly.
Figure 4:
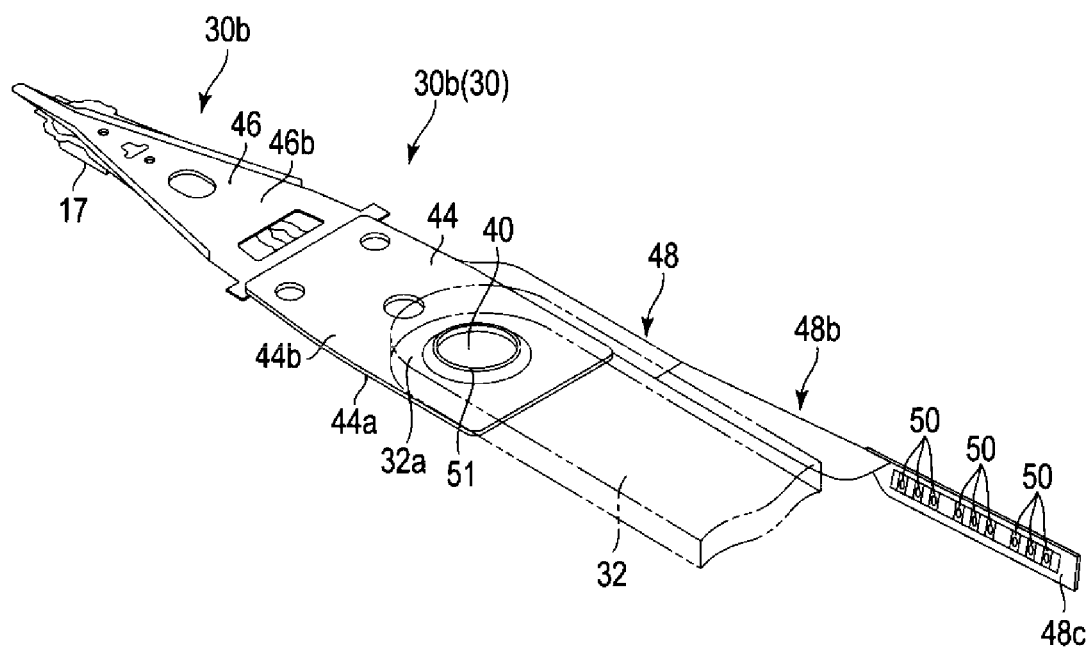
FIG. 4 is a perspective view showing the upper surface side (the side opposed to the head surface) of the head suspension assembly.

FIGS. 3 and 4 are perspective views of one of the suspension assemblies 30 of the HDD, where FIG. 3 shows the lower surface side (i.e., the side of the suspension assembly 30 on which the associated magnetic head 17 is mounted) and FIG. 4 shows the upper surface side (i.e., the side of the suspension assembly 30 that is opposed to the head surface). In the present embodiment, the carriage assembly 22 has ten suspension assemblies 30, and all the suspension assemblies 30 have substantially the same configuration. The plurality of suspension assemblies 30 include up-head suspension assemblies 30a, each of which supports and moves a magnetic head 17 upward toward a lower surface of an associated magnetic disk 18 as shown in FIG. 3. In addition, the plurality of suspension assemblies 30 include down-head suspension assemblies 30b, each of which supports and moves a magnetic head 17 downward toward an upper surface of an associated magnetic disk 18, as shown in FIG. 4. The up-head suspension assemblies 30a and the down-head suspension assemblies 30b are arranged such that the suspension assemblies 30 each up-head suspension assembly 30a is only adjacent to one or two down-head suspension assemblies 30b and vice versa. Thus, no up-head suspension assembly 30a is adjacent to a down-head suspension assembly 30b. It should be noted that the assembly including the suspension assemblies 30 and the magnetic heads 17 mounted thereon is referred to as a head suspension assembly.

As shown in FIGS. 3 and 4, each of the suspension assemblies 30 includes a base plate 44 having a substantially rectangular shape, a load beam 46 having an elongated leaf spring shape, and a flexible wiring member 48 having an elongated strip shape. A base end portion of the load beam 46 (i.e., the end of load beam 46 that is distal from the magnetic head 17) is fixedly stacked on the end portion of the base plate 44 (i.e., the end of base plate 44 that is distal to arm 32). The load beam 46 extends from the base plate 44 and is tapered toward the extended end. The base plate 44 and the load beam 46 are formed of, for example, stainless steel. For example, the thickness of the base plate 44 is formed to be about 150 μm, and the thickness of the load beam 46 is formed to be about 25 to 30 μm.

The base plate 44 has a first surface 44a (facing upward in FIG. 3), which is the surface on which load beam is fixedly stacked, and a second surface 44b (facing upward in FIG. 4) which is opposite to the first surface 441. The base plate 44 has a circular opening at the base end thereof, and an annular protrusion 51 disposed around the opening, and the protrusion 51 protrudes from the second surface 44b of the base plate 44. As shown in FIG. 2 to FIG. 4, the base plate 44 is positioned so that the second surface 44b on the base end portion is stacked on the seat surface 41 of the tip portion 32a (shown in FIG. 4) of each of the arms 32. The base plate 44 is fastened to the tip portion 32a of the arm 32 by fitting the protrusion 51 of the base plate 44 into the circular hole 40 formed in the arm 32. The first surface 44a of the base plate 44 is located on the side of base plate 44 that faces toward the surface of the magnetic disk 18 that corresponds to the arm 32.

The load beam 46 has a first surface 46a (shown in FIG. 3) and a second surface 46b (shown in FIG. 4) opposite thereto. A base end portion of the load beam 46 on the second surface 46b side is stacked on and in contact with a tip portion of the base plate 44 on the first surface 44a side and is welded at a plurality of portions, thus, the load beam 46 is fixed to the base plate 44. The first surface 46a of the load beam 46 faces toward the surface of the magnetic disk 18 that corresponds to the arm 32. The width of the base end portion of the load beam 46 is formed to be substantially equal to the width of the tip portion of the base plate 44.

The flexible wiring member 48 of the suspension assembly 30 includes a base metal plate made of, for example, stainless steel, an insulating layer formed on the metal plate, a conductive layer disposed on the insulating layer and forming a plurality of conductive lines, and a cover layer (e.g., protective layer, or insulating layer) covering the conductive layer, which together form an elongated strip-shaped laminated member. The layered structure of the flexible wiring member 48 will be described later in detail.

The flexible wiring member 48 has a tip portion 48a mounted on the first surface 46a of the load beam 46 and on the first surface 44a of the base plate 44, and a base end portion 48b extending outward from the side edge of the base plate 44 and further extending to the base end portion of the arm 32 along the side edge portion of the base plate 44 and the arm 32. The flexible wiring member 48 on the metal plate side is attached or pivot welded to the first surface 46a of the load beam 46 and the first surface 44a of the base plate 44. The flexible wiring member 48 has a tip portion 48a positioned on the load beam 46 and a displaceable gimbal portion (such as an elastic support portion) 52 formed on the tip portion. The magnetic head 17 is mounted on the gimbal portion 52. The wiring of the flexible wiring member 48 is electrically connected to the read element, the write element, the heater, and other members of the magnetic head 17.

The base end side portion 48b of the flexible wiring member 48 extends outward from the side edge of the base plate 44, and then, extends along the side edge and one side edge of the arm 32 to the base end of the arm 32. A connection end portion 48c of the flexible wiring member 48 is formed at one end of the base end side portion 48b. The connection end portion 48c is formed in an elongated rectangular shape. The connection end portion 48c is bent at a right angle with respect to the base end side portion 48b and is oriented substantially perpendicular to a major surface of arm 32 as shown. A plurality of, for example, nine connection terminals (also referred to as connection pads) 50 are disposed on the connection end portion 48c. The connection terminals 50 are each electrically connected to a respective conductive line of the flexible wiring member 48. In sum, each of the plurality of conductive lines of the flexible wiring member 48 extends over almost the entire length of the flexible wiring member 48, one end of which is electrically connected to the magnetic head 17, and the other end of which is connected to a connection terminal 50 included in the connection end portion 48c.

As shown in FIG. 2, in the carriage assembly 22, the base plate 44 of the uppermost down-head suspension assembly 30b is fixed to the seat surface 41 on the lower surface side of the front end portion 32a of the uppermost arm 32. On the second, third, fourth, and fifth arms 32 from the top, the up-head suspension assembly 30a and the down-head suspension assembly 30b are fixed to the upper and lower seat surfaces 41 of a tip portion 32a, respectively. Further, the base plate 44 of the up-head suspension assembly 30a is fixed to the seat surface 41 on the upper surface side of the front end portion 32a of the lowermost arm 32.

The ten suspension assemblies 30 extend from the six arms 32 and are arranged substantially in parallel so as to face each other at predetermined intervals. Five down-head suspension assemblies 30b and five up-head suspension assemblies 30a form these suspension assemblies 30. Sets of the down-head suspension assemblies 30b and the up-head suspension assemblies 30a are positioned parallel to each other at predetermined intervals and the magnetic heads 17 supported by these suspension assemblies 30 are oriented facing each other. Each of these magnetic heads 17 is positioned to face a surface of magnetic disk 18 that corresponds to the magnetic head 17.

As shown in FIG. 2, the FPC unit 21 includes a substantially rectangular base portion 60, an elongated strip-shaped relay segment 62 extending from one side edge of the base portion 60, and a substantially rectangular joint portion 64 disposed on a carriage assembly end of the relay segment 62. The base portion 60, the relay segment 62 and the joint portion 64 are formed from a flexible printed circuit board (FPC). The flexible printed circuit board has an insulating layer of polyimide or the like, a conductive layer provided on the insulating layer and forming a plurality of conductive lines, a connection pad and the like, and a protective layer covering the conductive layer. Electronic components such as a conversion connector (not shown), a plurality of capacitors 63 and the like are mounted on one surface (e.g., an outer surface, not shown) of the base portion 60, and are electrically connected to conductors (not shown). Two metal plates 70, 71, serving as reinforcing plates, are attached to the other surface (i.e., inner surface) of the base portion 60. The base portion 60 is bent by 180 degrees at a region located adjacent to the edges of the metal plate 70 and the metal plate 71, and the metal plates 70 and 71 are stacked to face each other. The base portion 60 is disposed on the bottom wall 12a of the housing 10 and screwed to the bottom wall 12a by two screws. The conversion connector on the base portion 60 is connected to a control circuit board disposed on the bottom side of the housing 10. From the first side edge of the base portion 60, the relay segment 62 extends substantially perpendicular to the first side edge (i.e., outward from the first side edge), then turns substantially at a right angle, and extends toward the carriage assembly 22.

Figure 5:
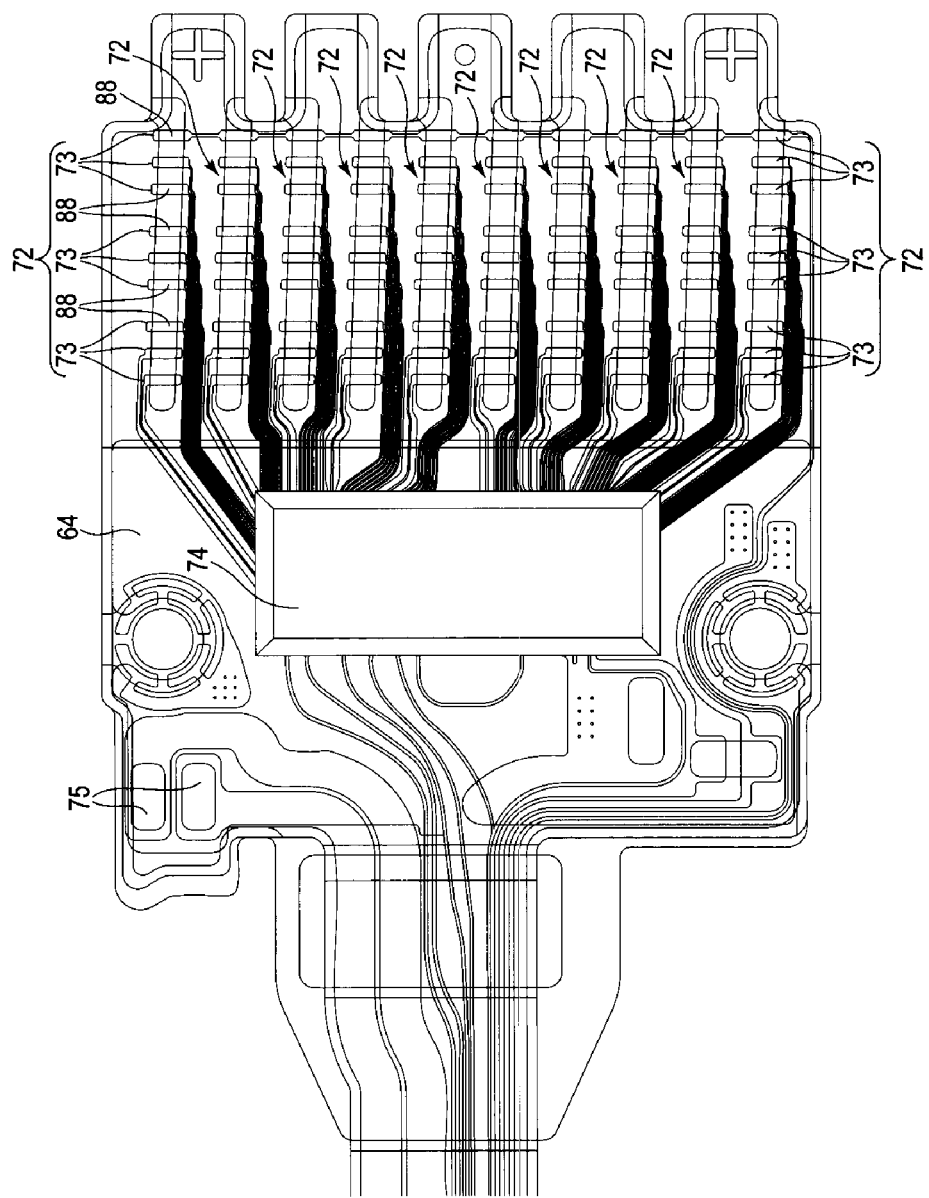
FIG. 5 is an enlarged side view showing a joint portion of an FPC unit.

FIG. 5 is an enlarged side view of the carriage assembly 22 showing the joint portion 64 of the FPC unit. As shown in the figure, the joint portion 64 has a rectangular shape having a width substantially equal to the height (i.e., the thickness) of the actuator block 29. The joint portion 64 has ten connection pad groups 72 that each correspond to a connection end portion 48c of the suspension assembly 30. Each of the connection pad groups 72 has, for example, nine connection pads 73 arranged in a row, and each connection pad 73 is electrically connected to the base portion 60 via wiring included in the relay segment 62. A head IC (also known as head amplifier) 74 is mounted on the joint portion 64, and is connected to the connection pad 73 and the base portion 60 via wiring. Furthermore, the joint portion 64 has two connection pads 75 for connecting the voice coil 34. On each of the connection pads 73, 75, a backing plate made of, for example, aluminum is attached as a reinforcing plate to the inner surface (i.e., a back surface) of the joint portion 64 where the solder 88 is disposed. The joint portion 64 configured in this manner is fixed to the first side surface of the carriage assembly 22, and, in this case, is screwed and fixed to the first side surface of the actuator block 29.

Figure 6:
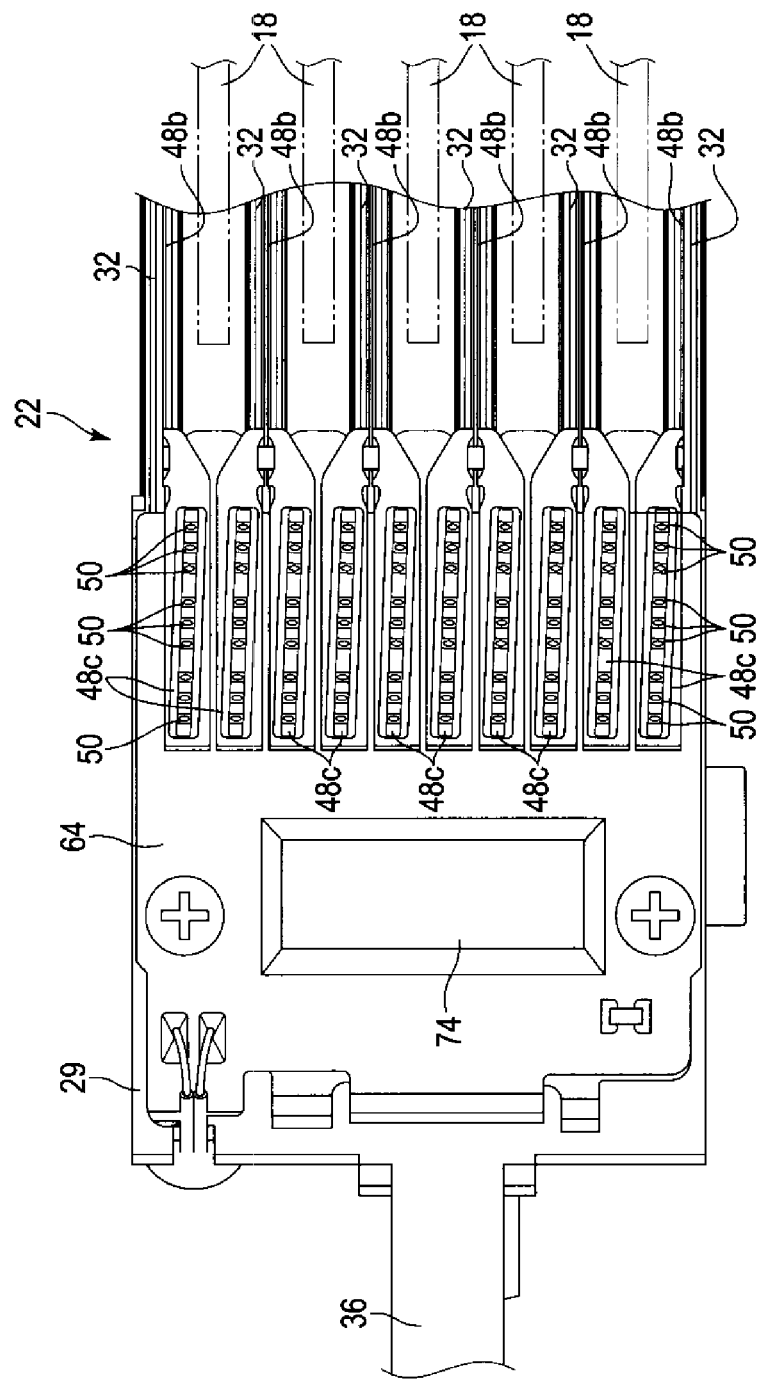
FIG. 6 is a side view showing of the joint portion between an FPC assembly of the suspension assembly and a connection end portion of the suspension assembly.

FIG. 6 is an enlarged side view showing the joint portion between the carriage assembly and the FPC unit. As shown in FIGS. 2 and 6, the connection end portions 48c of the ten suspension assemblies 30 extend along the first side surface side of the carriage assembly 22, and are joined to the joint portion 64 of the FPC unit 21. Specifically, the connection terminals 50 of each connection end portion 48c is electrically and mechanically coupled to the connection pads 73 of a corresponding connection pad group 72 on the first joint portion 64 by solder 88 or the like. In addition, the wiring of the voice coil 34 is connected to the connection pads 75 of the joint portion 64. Thus, each of the ten magnetic heads 17 is electrically connected to the base portion 60 through the wiring of the flexible wiring member 48, the connection end portion 48c, the joint portion 64 of the FPC unit 21, and the relay segment 62. Furthermore, the base portion 60 is connected to the printed circuit board on the bottom side of the housing 10 via the conversion connector.

Figure 7:
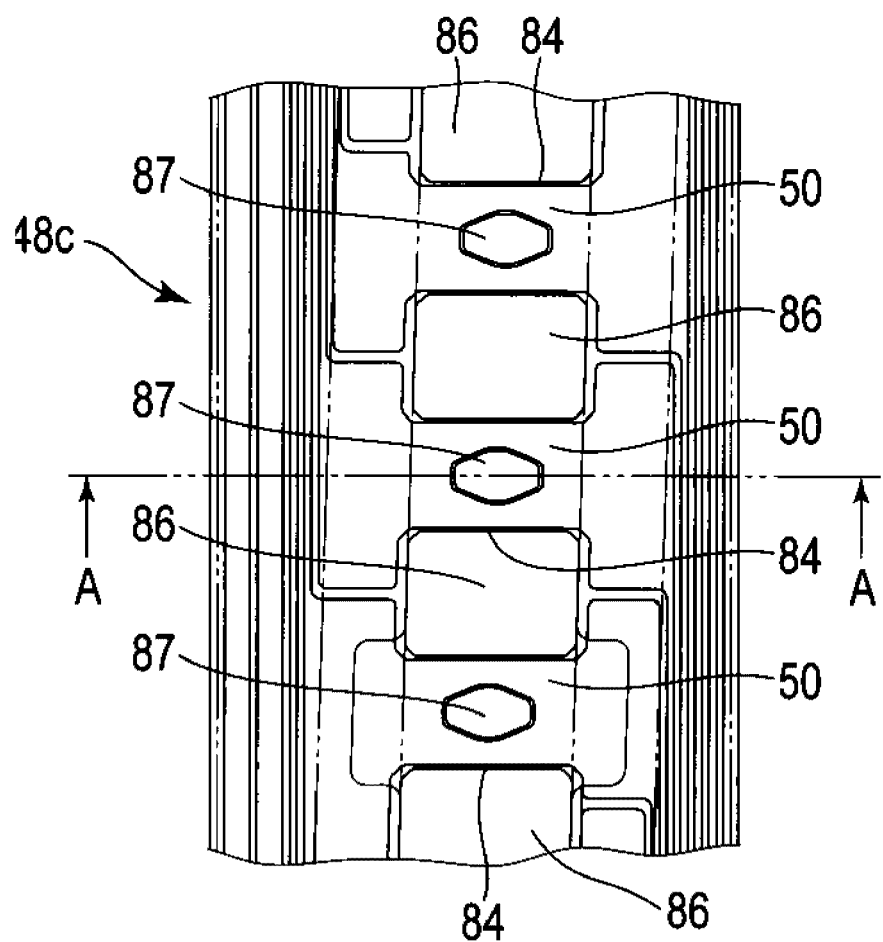
FIG. 7 is an enlarged plan view of the connection end portion.
Figure 8A:
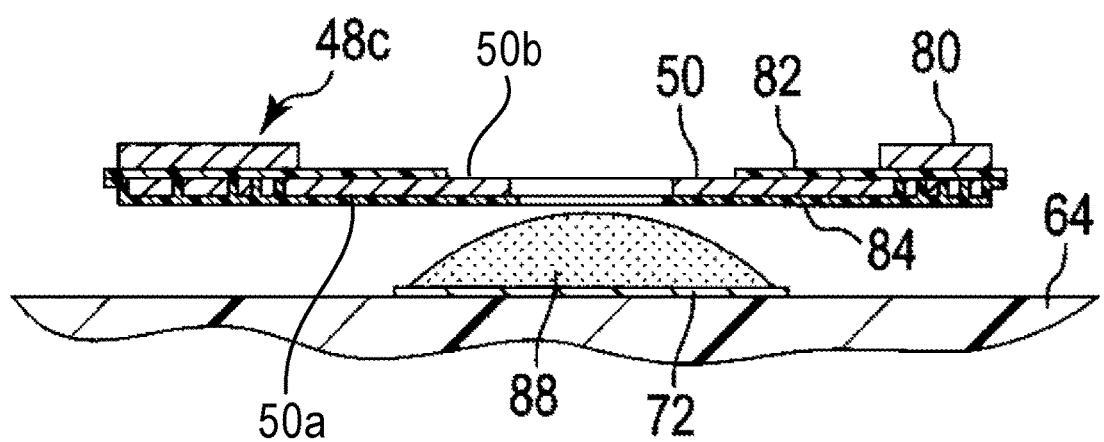
FIG. 8A is a cross-sectional view showing a cross section of the connection end portion along line A-A of FIG. 7 and a solder joint portion of the FPC assembly prior to solder-joining.

Next, the laminated structure of the connection end portion 48c of the flexible wiring member 48 will be described in detail. FIG. 7 is an enlarged plan view of a part of a single connection end portion 48c. FIG. 8A is a cross-sectional view showing, prior to a solder-joining process, a cross section of the connection end portion along line A-A in FIG. 7 and a cross section of a joint portion of the FPC unit. As shown in FIG. 7 and FIG. 8A, the flexible wiring member 48 and the connection end portion 48c include a base metal plate 80 made of, for example, stainless steel, an insulating layer 82 stacked on the metal plate 80, a conductive layer stacked on the insulating layer 82 and forming a plurality of wirings (e.g., wiring patterns and, in FIGS. 8B and 8C, connection terminals 50), such as a copper foil layer, for example, and a cover layer (which is an insulating layer) 84 covering the conductive layer. Together, the metal plate 80, the conductive layer that includes connection terminals 50, and the cover layer 84 form an elongated strip-shaped laminate, i.e., a flexible wiring member 48 with a connection end portion 48c.

In the connection end portion 48c, a plurality of through holes 86 (indicated in FIG. 7) are formed longitudinally at predetermined intervals. Each connection terminal 50 formed from the above-described conductive layer is disposed between adjacent through holes 86. Each connection terminal 50 is connected to the relay portion via conductive wiring. As shown, a center hole 87 is formed in each connection terminal 50 so as to penetrate the central portion of each connection terminal 50. Each connection terminal 50 has a first terminal surface 50a facing the joint portion 64, and a second terminal surface 50b facing away from the first terminal surface 50a. The cover layer 84 is formed so as to be stacked on most or all of the conductive layer that forms connection terminals 50, as well as the first terminal surface 50a of the connection terminal 50. In the present embodiment, the cover layer 84 extends past and covers both outer side edges of each connection terminal 50, and extends inward from the periphery of the center hole 87 toward a center point of each center hole 87, i.e., inward past the inner side edges of each center hole 87. Thus, the cover layer 84 covers the entire surface of the first terminal surface 50a of the connection terminal 50, as shown in FIGS. 8A and 8B.

As shown in FIG. 8A, the connection end portion 48c is oriented so that the cover layer 84 side of the connection end portion 48c faces the joint portion 64. In addition, each connection terminal 50 is configured so that the center hole 87 formed therein is aligned with a corresponding connection pad 73 and solder 88 on the joint portion 64. Prior to solder joining of connection end portions 48c with corresponding solder 88, the cover layer 84 of the connection end portion 48c faces or contacts the solder 88. More specifically, the portion of the cover layer 84 that extends inward from the periphery of each center hole 87 toward a center point of the center hole 87 prevents the conductive layer or the connection terminal 50 from being brought into direct contact with the solder 88.

Figure 8B:
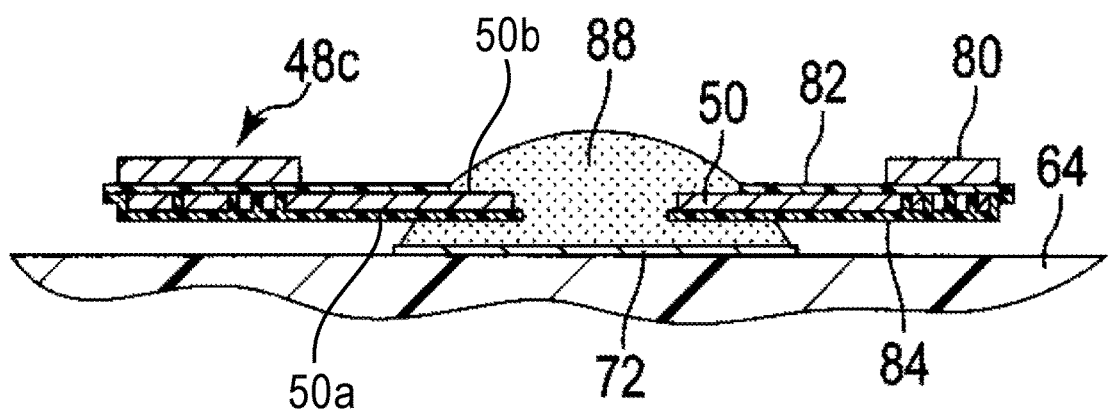
FIG. 8B is a cross-sectional view showing the connection end portion and the solder joint portion after a solder-joining process.

FIG. 8B is a cross-sectional view showing a connection end portion 48c after a solder-joining process in which the solder 88 is heated and melted, and the connection end portion 48c is electrically connected and mechanically joined to the joint portion 64. As shown in the figure, the solder 88 passes through the through hole 86 and the center hole 87 in the connection end portion 48c and flows into contact with the second terminal surface 50b side of each connection terminal 50. In this way, the solder 88 is joined to the connection terminal 50. As a result, each connection terminal 50 of the connection end portion 48c is electrically and mechanically connected to the connection pad 73 on the joint portion 64, and necessary conduction and mechanical strength are obtained. In this way, the magnetic head 17 is electrically connected to the FPC unit 21 via the flexible wiring member 48. It should be noted that, in heating and melting the solder 88, laser light can be directed through the through hole 86 and the center hole 87 of the connection end portion 48c to heat and melt the solder 88 in a contact-free manner, and a metal tool such as a soldering iron is not brought into direct contact with the connection terminal 50.

As shown in FIG. 1, in which the carriage assembly 22 as described above is depicted incorporated onto the base 12, the lower end portion of the pivot shaft of the bearing unit 28 is fixed to the base 12 so as to be erected substantially in parallel with the spindle of the spindle motor 19. Each magnetic disk 18 is located between two suspension assemblies 30. During operation of the HDD, the magnetic heads 17 attached to the suspension assembly 30 face either an upper or lower surface of a magnetic disk 18, respectively. The base portion 60 of the FPC unit 21 is fixed to the bottom wall 12a of the base 12.

Figure 8C:
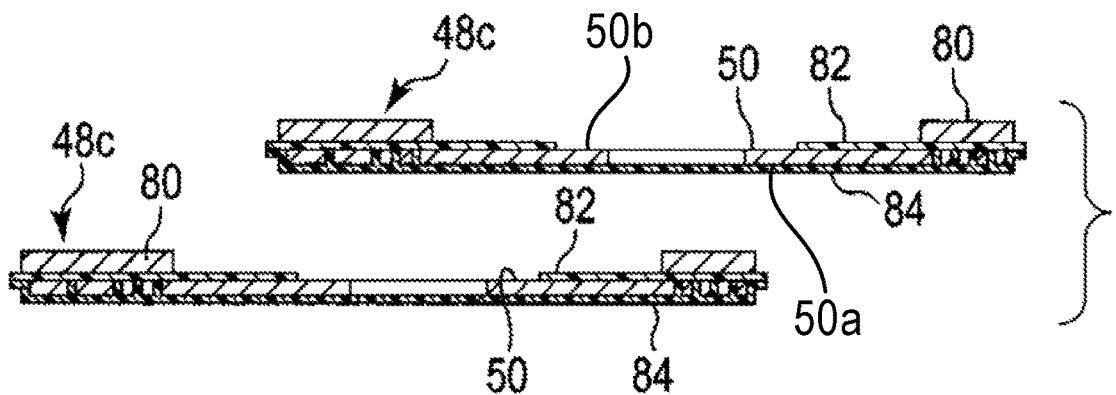
FIG. 8C is a cross-sectional view showing the plurality of connection end portions positioned close to each other before a solder-joining process.

According to the HDD and the suspension assembly 30 configured as described above, at the connection portion 48c of the flexible wiring member 48 that is electrically connected to the joint portion 64 of the FPC unit 21, the connection pads 73 of the joint portion 64 and the terminal surface of the connection terminal 50 facing toward the solder 88 are electrically separated from each other by the cover layer 84. As a result, prior to a solder-joining process, the connection terminal 50 cannot be brought into contact with the solder 88. Even when two or more of the plurality of connection end portions 48c overlap in the assembly process as shown in FIG. 8C, the connection terminal 50 cannot be brought into contact with the metal plate 80 of an adjacent connection end portion 48c. This makes it possible to reduce or eliminate the generation of ESD due to physical contact of metals (or between metals) during the assembly of the carriage assembly 22, and to significantly reduce or prevent damage to any of the magnetic head elements 17 include in the carriage assembly 22.

Next, the wiring member of the HDD according to another embodiment will be described. In another embodiment described below, the same elements as those in the above-described first embodiment are denoted by the same reference numerals, detailed explanation thereof is omitted or simplified, and elements that are different from the first embodiment will be described.

Second Embodiment

Figure 9:
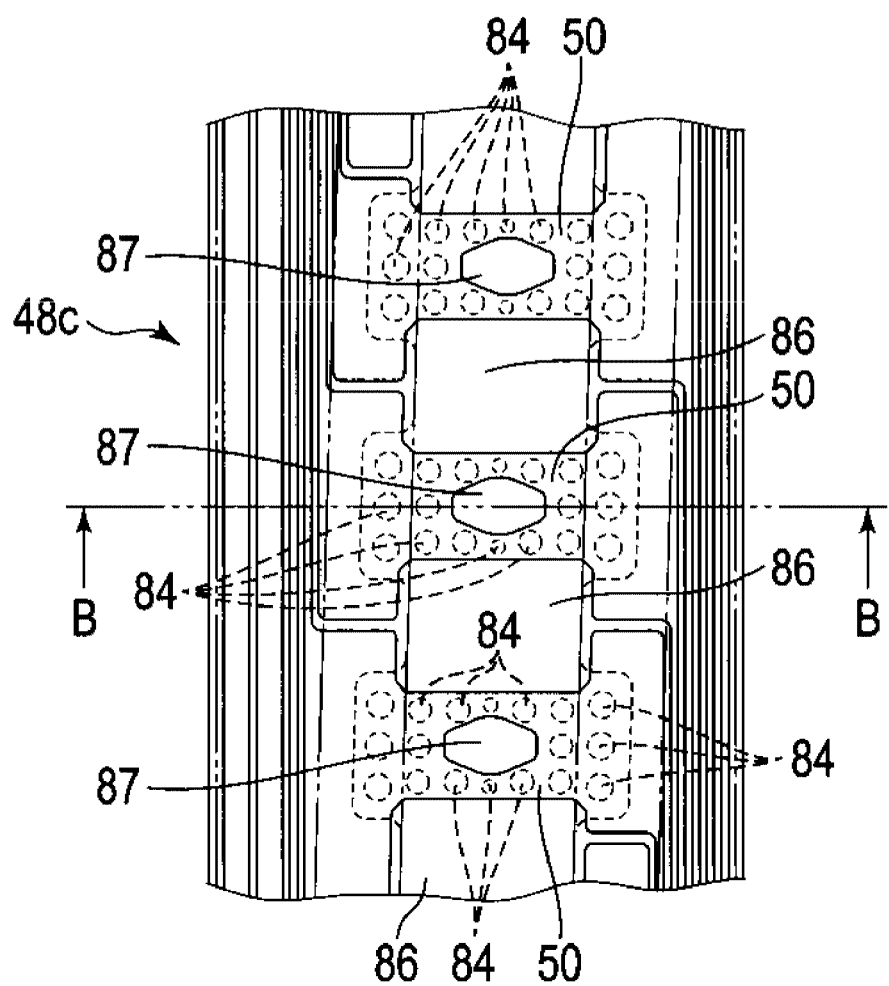
FIG. 9 is an enlarged plan view showing a connection end portion of a head suspension assembly according to a second embodiment.
Figure 10A:
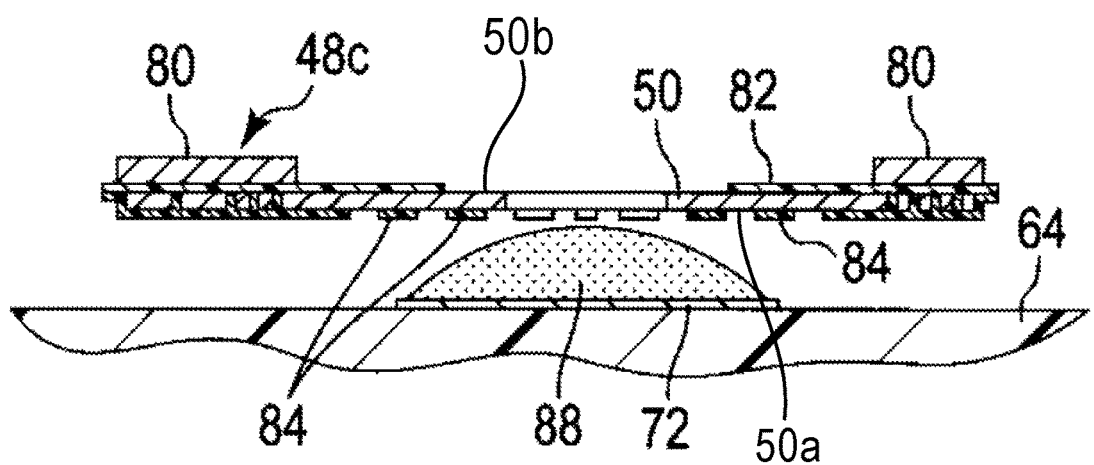
FIG. 10A is a cross-sectional view showing a cross section of the connection end portion along line B-B of FIG. 9 and a solder joint portion of the FPC assembly.

FIG. 9 is an enlarged plan view showing a part of the connection end portion 48c of a flexible wiring member 48 according to the second embodiment, and FIG. 10A is a cross-sectional view showing a cross section of the connection end portion 48c along line B-B of FIG. 9 and a cross section of a joint portion of the FPC unit. As shown in FIG. 9 and FIG. 10A, the flexible wiring member 48 and the connection end portion 48c include a base metal plate 80 made of, for example, stainless steel, an insulating layer 82 formed on the metal plate 80, a conductive layer disposed on the insulating layer 82 and forming a plurality of conductive wiring patterns, including connection terminals 50, such as a copper foil layer, and a cover layer (which is an insulating layer) 84 covering the conductive layer, which together form an elongated strip-shaped laminate.

In the connection end portion 48c, a plurality of through holes 86 are formed longitudinally on the connection end portion 48c at predetermined intervals. Each connection terminal 50 formed from the conductive layer 83 is disposed between two adjacent through holes 86. Each connection terminal 50 is connected to the relay segment via conductive wiring. A center hole 87 is formed so as to penetrate the central portion of each connection terminal 50. In the present embodiment, the cover layer 84 is formed so as to be stacked on the entire surface of the wiring portion of the conductive layer that forms connection terminals 50. Further, each connection terminal 50 has a first terminal surface 50a facing the solder 88, and a second terminal surface 50b facing away from the first terminal surface 50a. On the first terminal surface 50a of the connection terminal 50, the cover layer 84 is formed with a discontinuous configuration, for example including a plurality of separate, discontinuous portions of the cover layer 84 (e.g., islands or dots of insulating material). In some embodiments, of the discontinuous cover layer 84 covers more than half of the first terminal surface 50a. In such embodiments, the second terminal surface 50b of the connection terminal 50 is exposed prior to a solder-joining process.

As shown in FIG. 10A, the connection end portion 48c is depicted prior to being joined by a solder joining process to solder 88. As shown, the cover layer 84 side faces the joint portion 64. In addition, each connection terminal 50 of the connection end portion 48c is oriented so that the center hole 87 is aligned with the connection pads 73 and the solder 88 on the joint portion 64. Prior to solder joining, in the tail terminal portion 48c, the cover layer 84 faces or contacts the solder 88. Therefore, no portion of the conductive layer or of the connection terminal 50 is can be brought into contact with the solder 88.

Figure 10B:
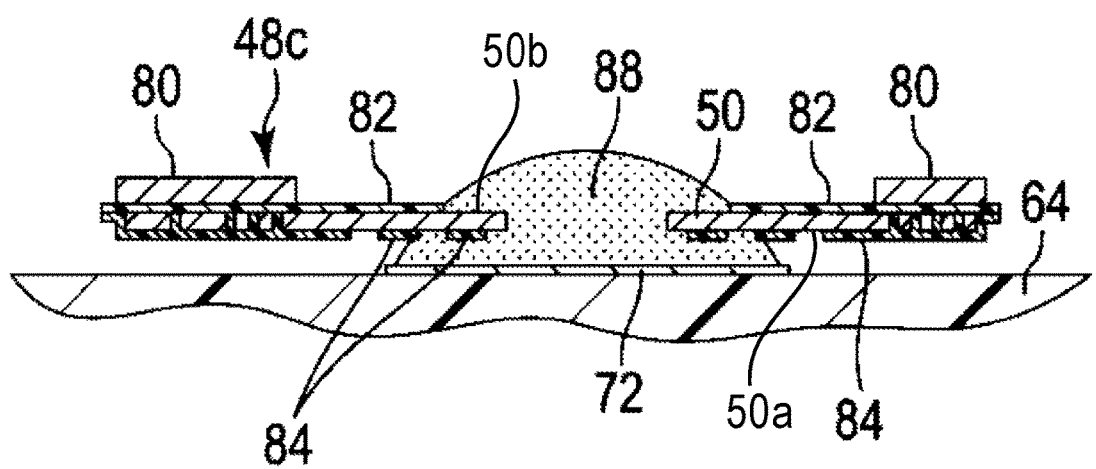
FIG. 10B is a cross-sectional view showing the connection end portion and the solder joint portion after a solder-joining process.

FIG. 10B is a cross-sectional view showing the tail terminal portion 48c electrically connected and mechanically joined to the joint portion 64 after a solder-joining process in which the solder 88 is heated and melted. As shown in the figure, the solder 88 passes through the through hole 86 and the center hole 87 in the connection end portion 48c and flows into contact with the second terminal surface 50b side of each connection terminal 50. In this way, the solder 88 is joined to the connection terminal 50. Further, on the first terminal surface 50a side of the connection terminal 50, the solder 88 flows between the separate and/or discontinuous islands of cover layer 84 to be joined to the second terminal surface 50b. As a result, each connection terminal 50 of the tail terminal portion 48c is electrically and mechanically connected to the connection pad 73 on the joint portion 64 via the solder 88 to both the first terminal surface 50a and the second terminal surface 50b. Thus, electrical conductivity and mechanical strength are obtained. In the second embodiment, other portions of the HDD are the same as that of the HDD according to the above-described first embodiment.

Figure 10C:
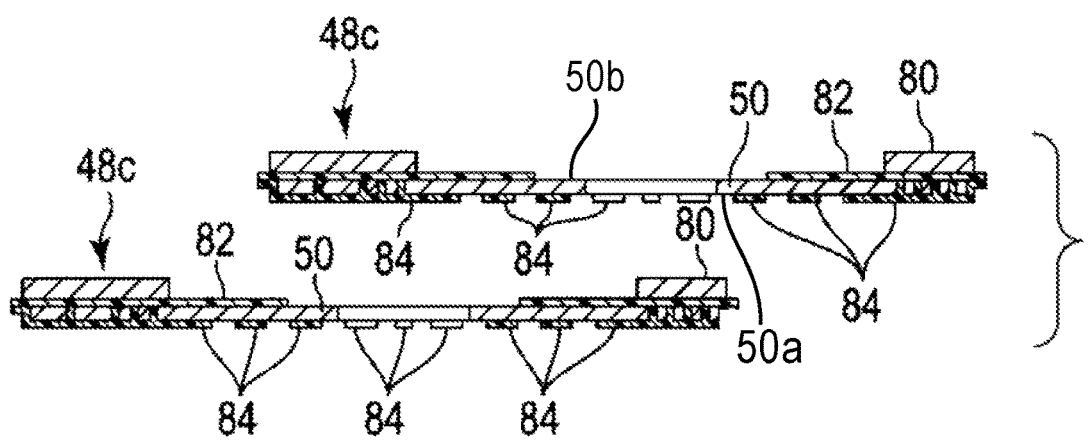
FIG. 10C is a cross-sectional view showing the plurality of connection end portions disposed close to each other prior to a solder-joining process.

According to the second embodiment of the HDD, configured as described above, the discontinuous cover layer 84 covers most of the terminal surface of the connection terminal 50 facing the connection pad 73 and the solder 88 on the joint portion 64. As a result, prior to a solder-joining process, the connection terminal 50 is not brought into contact with the solder 88. Further, even when the plurality of connection end portions 48c overlap in the assembly process as shown in FIG. 10C, the connection terminal 50 of one connection end portion 48c cannot be brought into contact with the metal plate 80 of another adjacent connection end portion 48c. This makes it possible to eliminate or reduce the generation of ESD due to physical contact of metals (or between metals) during the assembly of the carriage assembly 22, and to significantly reduce or prevent damage to the magnetic head elements 17. In the second embodiment, a large number of island-shaped, dot-shaped, or otherwise discontinuous cover layer 84 portions are disposed on the first terminal surface 50a of the connection terminal 50, thereby improving solder wettability with respect to the first terminal surface 50a. Thus, it is possible to more stably join the connection end portion 48c to the joint portion 64 electrically and mechanically via a solder-joining process. It should be noted that, in the second embodiment, the shape of the cover layer 84 disposed on the first terminal surface 50a is not limited to a circular dot shape, and may be in any technically feasible shape.

The present invention is not limited to the above-described embodiments or modifications, and may be implemented by modifying a component without departing from the scope of the embodiments described herein. Further, various inventions can be formed by suitably combining the components disclosed in the embodiments. For example, some of the components disclosed in the embodiments may be deleted. In addition, components in different embodiments may be combined. The number of magnetic disks is not limited to five, but may be four or less, or six or more, and the number of suspension assemblies and the number of magnetic heads may be increased or decreased depending on the number of installed magnetic disks. At the connection end of the suspension assembly, the number of connection terminals is not limited to nine, and can be increased or decreased as necessary. Materials, shapes, sizes, and the like, of elements included in the disk device are not limited to the above-described embodiments, and various modifications can be made as necessary.

What is claimed is:

1. A magnetic head suspension assembly, comprising:
a support plate coupled to a magnetic head, and
a flexible wiring member disposed on the support plate, wherein the flexible wiring member includes a tip portion disposed on the support plate and a connection end portion disposed at an opposite end of the flexible wiring member from the tip portion,
the flexible wiring member further including a metal plate fixed to the support plate, an insulating layer disposed on the metal plate, a conductive layer which is disposed on the insulating layer and forms a plurality of conductive lines and a plurality of connection terminals, and a cover layer that is disposed on the conductive layer and includes an electrically insulative material,
the connection end portion including the plurality of connection terminals formed from the conductive layer, and
each of the plurality of connection terminals including a center hole, a first terminal surface that is a surface of the conductive layer and is fully covered with the cover layer so that the first terminal surface is not exposed during a solder-joining process performed on the connection terminals, and a second terminal surface that is a surface of the conductive layer and faces away from the first terminal surface.

2. The magnetic head suspension assembly according to claim 1, wherein the connection terminals are arranged longitudinally along the connection end portion and are separated by through holes in the conductive layer.

3. The magnetic head suspension assembly according to claim 1, wherein in each connection terminal, the cover layer extends inward from a peripheral edge of the center hole toward a center point of the center hole.

4. The magnetic head suspension assembly according to claim 1, wherein the center holes receive solder during a solder-joining process.

5. The magnetic head suspension assembly according to claim 1, wherein each center hole is formed in a central portion of the connection terminal.

6. The magnetic head suspension assembly according to claim 1, wherein the support plate is coupled to the magnetic head via a load beam on which the magnetic head is mounted.

7. The magnetic head suspension assembly according to claim 1, wherein the second terminal surface is partially covered with the insulating layer.

8. A magnetic head suspension assembly, comprising:
a support plate coupled to a magnetic head, and
a flexible wiring member disposed on the support plate, wherein the flexible wiring member includes a tip portion disposed on the support plate and a connection end portion disposed at an opposite end of the flexible wiring member from the tip portion,
the flexible wiring member further including a metal plate fixed to the support plate, an insulating layer disposed on the metal plate, a conductive layer which is disposed on the insulating layer and forms a plurality of conductive lines and a plurality of connection terminals, and a cover layer that is disposed on the conductive layer and includes an electrically insulative material,
the connection end portion including the plurality of connection terminals formed from the conductive layer, and
each of the plurality of connection terminals including a center hole, a first terminal surface that is a surface of the conductive layer and has a plurality of discontinuous portions of the cover layer formed thereon, and a second terminal surface that is a surface of the conductive layer and faces away from the first terminal surface.

9. The suspension assembly according to claim 8, wherein the connection terminals are arranged longitudinally along the connection end portion and are separated by through holes in the conductive layer.

10. The magnetic head suspension assembly according to claim 8, wherein in each connection terminal, the plurality of discontinuous portions of the cover layer formed on the first terminal surface covers more than half of the first terminal surface.

11. The magnetic head suspension assembly according to claim 8, wherein the discontinuous portions of the cover layer include a plurality of dot-shaped cover layers disposed on the first terminal surface of each connection terminal.

12. The magnetic head suspension assembly according to claim 8, wherein the center holes receive solder during a solder-joining process.

13. The magnetic head suspension assembly according to claim 8, wherein each center hole is formed in a central portion of the connection terminal.

14. The magnetic head suspension assembly according to claim 8, wherein the support plate is coupled to the magnetic head via a load beam on which the magnetic head is mounted.

15. The magnetic head suspension assembly according to claim 8, wherein in each connection terminal, the second terminal surface is exposed prior to a solder-joining process.

16. A disk device comprising:
a disk-shaped recording medium having a magnetic recording layer,
a carriage assembly with a plurality of connection pads formed thereon, and
a magnetic head suspension assembly that is mounted on the carriage assembly and includes a support plate coupled to a magnetic head, and a flexible wiring member disposed on the support plate, wherein the flexible wiring member includes a tip portion disposed on the support plate and a connection end portion disposed at an opposite end of the flexible wiring member from the tip portion, the flexible wiring member further including a metal plate fixed to the support plate, an insulating layer disposed on the metal plate, a conductive layer which is disposed on the insulating layer and forms a plurality of conductive lines and a plurality of connection terminals, and a cover layer that is disposed on the conductive layer and includes an electrically insulative material, the connection end portion including the plurality of connection terminals formed from the conductive layer, and each of the plurality of connection terminals including a center hole, solder disposed within the center hole, a first terminal surface that is a surface of the conductive layer and is fully covered with the cover layer, and a second terminal surface that is a surface of the conductive layer that faces away from the first terminal surface and contacts the solder.

17. The disk device according to claim 16, wherein the connection terminals are arranged longitudinally along the connection end portion and are separated by through holes in the conductive layer.

18. The disk device according to claim 16, wherein each of the connection terminals is aligned with a respective connection pad formed on the carriage assembly.

19. The disk device according to claim 16, wherein the first terminal surface has a plurality of discontinuous portions of the cover layer formed thereon and a portion of the first terminal surface contacts the solder.

20. The disk device according to claim 19, wherein in each connection terminal, the plurality of discontinuous portions of the cover layer formed on the first terminal surface covers more than half of the first terminal surface.

* * * * *